United States Patent
Iadanza et al.

(10) Patent No.: US 11,650,226 B2
(45) Date of Patent: May 16, 2023

(54) APPARATUS AND METHOD FOR TESTING A SUBMARINE HIGH VOLTAGE CABLE SYSTEM

(71) Applicant: Prysmian S.p.A., Milan (IT)

(72) Inventors: Andrea Iadanza, Milan (IT); Paolo Boffi, Lecco (IT); Christian Sarti, Ponte Lambro (IT)

(73) Assignee: PRYSMIAN S.P.A., Milan (IT)

(*) Notice: Subject to any disclaimer, the term of this patent is extended or adjusted under 35 U.S.C. 154(b) by 121 days.

(21) Appl. No.: 17/241,530

(22) Filed: Apr. 27, 2021

(65) Prior Publication Data
US 2021/0364548 A1    Nov. 25, 2021

(30) Foreign Application Priority Data

May 20, 2020   (IT) ................... 102020000011653

(51) Int. Cl.
*G01R 1/04* (2006.01)
*G01R 31/58* (2020.01)
(Continued)

(52) U.S. Cl.
CPC ........... *G01R 1/0416* (2013.01); *G01R 31/58* (2020.01); *H01B 7/14* (2013.01); *H01B 7/1805* (2013.01); *H02G 1/14* (2013.01); *H02G 15/06* (2013.01)

(58) Field of Classification Search
CPC .... G01R 1/0416; G01R 31/58; G01R 31/083; H01B 7/14; H01B 7/1805; H02G 1/14;
(Continued)

(56) References Cited

U.S. PATENT DOCUMENTS

| | | | | |
|---|---|---|---|---|
| 4,479,690 A | * | 10/1984 | Inouye | .................. H02G 15/14 |
| | | | | 439/190 |
| 4,722,590 A | * | 2/1988 | Thomas | ............... G02B 6/4448 |
| | | | | 385/107 |

(Continued)

FOREIGN PATENT DOCUMENTS

| | | | | |
|---|---|---|---|---|
| EP | 2503093 A2 | * | 9/2012 | .......... E21B 17/017 |
| EP | 2503093 A2 | | 9/2012 | |

(Continued)

OTHER PUBLICATIONS

Search Report and Written Opinion issued in Italian Patent Application No. IT202000011653; dated Jan. 14, 2021; 13 pages, including English translation of Written Opinion.

*Primary Examiner* — Akm Zakaria
(74) *Attorney, Agent, or Firm* — Ulmer & Berne LLP

(57) ABSTRACT

The present disclosure relates to a submersible apparatus (1) for testing a submarine high voltage (HV) cable system. The apparatus (1) includes a cable termination (100) including an electrical insulator (101) and a shielding electrode (102) for the electrical connection with a cable end (201). The apparatus (1) additionally includes a cable bend restrictor (300) having a through channel (301), and a termination locking (400) in through communication with the cable bend restrictor (300) and the cable termination (100). According to another aspect, a method for testing a submarine high voltage (HV) cable apparatus using the above testing apparatus (1) is additionally disclosed.

15 Claims, 5 Drawing Sheets

(51) Int. Cl.
*H01B 7/14* (2006.01)
*H01B 7/18* (2006.01)
*H02G 1/14* (2006.01)
*H02G 15/06* (2006.01)

(58) Field of Classification Search
CPC ...... H02G 15/06; H02G 9/025; H02G 3/0475; H02G 9/02; H02G 15/007; H02G 15/14; H02G 1/10
See application file for complete search history.

(56) References Cited

U.S. PATENT DOCUMENTS

| | | | |
|---|---|---|---|
| 9,306,340 B2 * | 4/2016 | Chen | H01R 13/6616 |
| 11,287,336 B2 * | 3/2022 | Godfrey | H02G 9/02 |

FOREIGN PATENT DOCUMENTS

| | | |
|---|---|---|
| EP | 2503093 A3 | 3/2017 |
| EP | 3422505 A1 | 1/2019 |
| NO | 20141165 A1 | 3/2016 |
| WO | 2008139190 A1 | 11/2008 |

\* cited by examiner

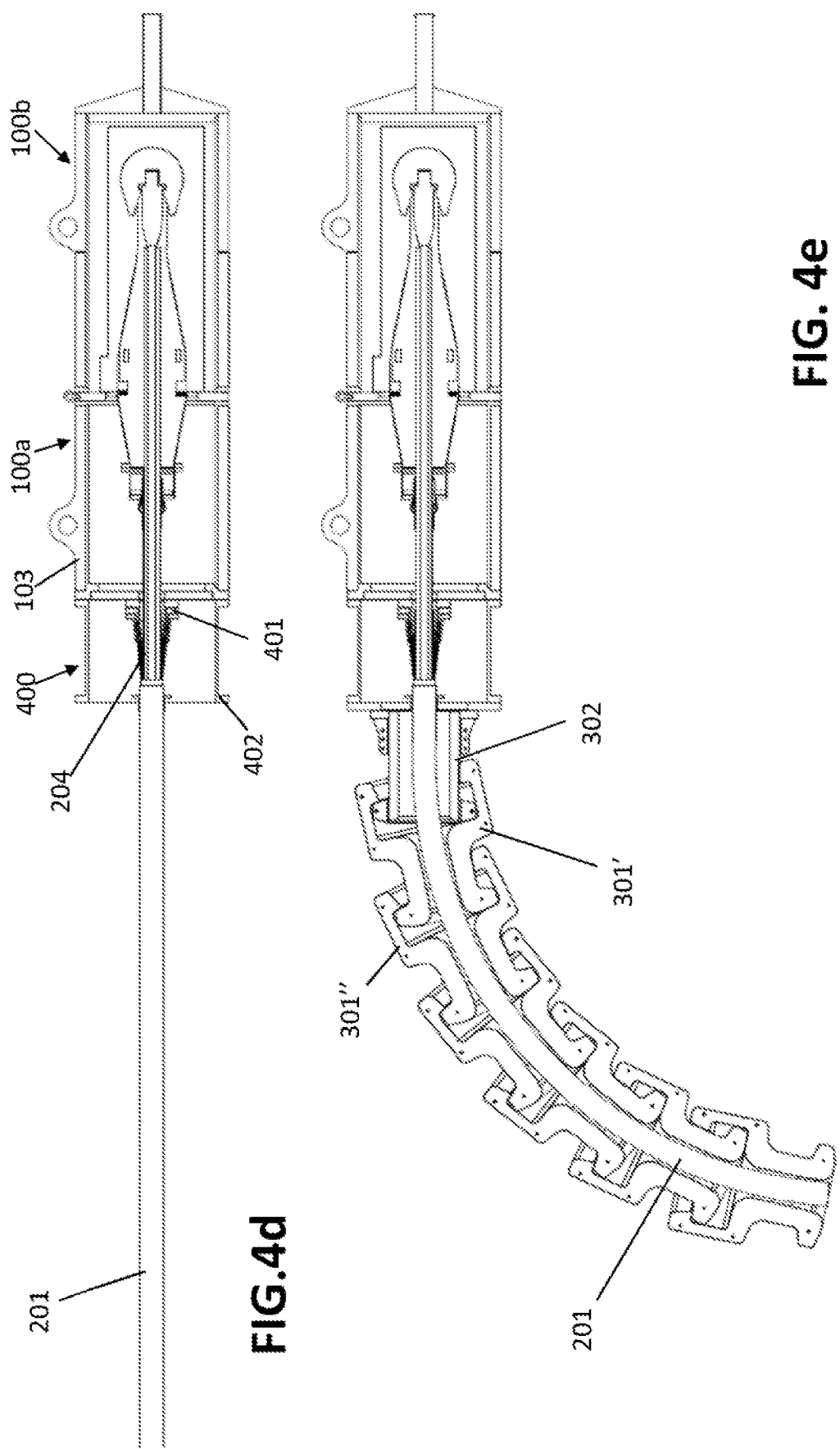

APPARATUS AND METHOD FOR TESTING A SUBMARINE HIGH VOLTAGE CABLE SYSTEM

BACKGROUND

Technical Field

The present disclosure relates to an apparatus and a method for testing a submarine high voltage (HV) cable system, particularly for HV testing on submarine interconnections.

Description of the Related Art

According to international standards (such as for example IEC 62067-01, 2001 October), a submarine cable system should be submitted to a commissioning test, particularly to Site Acceptance Testing (SAT) before being released to the final customer. The purpose of this test is to check whether any damage has been caused during the installation of the cable system. Clearly, for a submarine cable interconnection a test failure on an already completed system has a huge impact in terms of costs and efforts requested to locate and repair the damage. Moreover, the detection of anomalies or issues at the end of the complete system installation (final site acceptance test) leads to restoring activities, extending time needed to complete the project and delivery the system to the customer.

Due to safety issues and high cost of offshore high voltage testing, onshore commissioning activities should be as comprehensive as possible. However, onshore tests need that the construction of the Offshore Substations (OSS) is substantially completed.

The possibility to test only part of the submarine system, without waiting for the completion of the installation, would introduce important advantages in terms of logistics and would be appreciated by the costumers. However, this should be done with a cable termination (such as outdoor terminations or GIS terminations) installed on a vessel, and this brings limitations in terms of health, safety and maximum achievable voltage.

WO 2008/139190 A1 relates to an apparatus and a method to deploy cable to the bed of the shallow water, in which the cable is pulled in through a guide having a protective sleeve, which is attached to a connector, until the connector fastens via a push-fit action to the guide on or adjacent the support structure, thereby also deploying the protective cable sleeve between the connector and the bed of the shallow water and providing a protected cable route between the guide and the bed of the shallow water.

SUMMARY OF THE DISCLOSURE

The Applicant aims at providing an apparatus and a method for testing a HV submarine system before completion of the installation, without the need of performing the tests on the vessel, thereby reducing the above-cited limitations.

This aim is achieved by a submersible apparatus for testing a submarine HV cable system comprising:
 a cable termination comprising an electrical insulator and a shielding electrode for the electrical connection with a cable end portion;
 a cable bend restrictor comprising a through channel; and
 a termination locking in through communication with the cable bend restrictor and the cable termination.

According to another aspect, the present disclosure relates to a method for testing a submarine high voltage cable system comprising the steps of:
 arranging a cable in a submersible apparatus comprising a cable bend restrictor, a termination locking and a cable termination by the following sub-steps:
 inserting a cable end of the cable in the termination locking;
 connecting the cable end, provided with an electric field control portion, to an electrically conductive shielding electrode housed within an electrical insulator in the cable termination; and
 positioning the cable end in the cable bend restrictor while connecting the bend restrictor to the termination locking;
 the sub-steps of inserting and connecting the cable end portion being carried out before the sub-step of positioning the cable in a cable bend restrictor;
 laying down the submersible apparatus containing the cable end portion to the sea floor;
 energizing the cable to perform an electric test thereon;
 de-energizing the cable;
 recovering the submersible apparatus containing the cable end.

In the present description and claim as "in through communication" means that two parts are connected in a way such to form a through passage.

The apparatus and method according to the present disclosure allows testing a part of the submarine system before the completion of the installation. The cable testing can be performed by laying down the submersible apparatus containing a cable end to the sea floor, without substantial limitations in terms of health, safety and/or maximum achievable voltage.

Examples of electric test which can be performed with the present method and/or apparatus are CIGRE TB496, 2012 (Recommendations for Testing DC Extruded Cable Systems for Power Transmission at a Rated Voltage up to 500 kV) and CIGRE TB490, 2012 (Recommendations for Testing of Long AC Submarine Cables with Extruded Insulation for System Voltage above 30 (36) to 500 (550) kV).

BRIEF DESCRIPTION OF THE DRAWINGS

Further characteristics and advantages will be more apparent from the following description of some embodiments given as a way of an example with reference to the enclosed drawings in which:

FIGS. 4a-4e show possible steps of a method for testing a submarine high voltage cable submersible apparatus according to an embodiment.

DETAILED DESCRIPTION

The present disclosure, in at least one of the aforementioned aspects, can be implemented according to one or more of the following embodiments, optionally combined together.

For the purpose of the present description and of the appended claims, the words "a" or "an" should be read to include one or at least one and the singular also includes the plural unless it is obvious that it is meant otherwise. This is done merely for convenience and to give a general sense of the disclosure.

Figure 1:
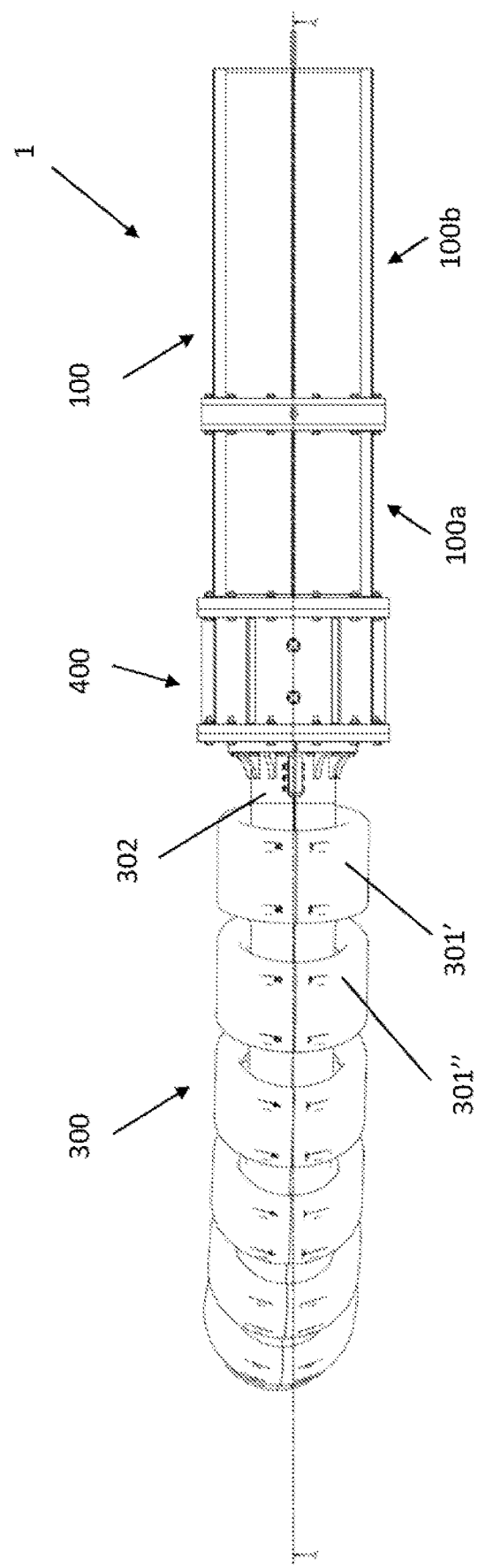
FIG. 1 is a side view of a submersible apparatus, in an assembled condition, for testing a submarine high voltage cable system according to an embodiment of the present disclosure.

FIG. 1 shows an embodiment of a submersible apparatus 1 for testing a submarine high voltage (HV) cable system comprising a cable termination 100, a cable bend restrictor 300 and a termination locking 400.

Figure 2:
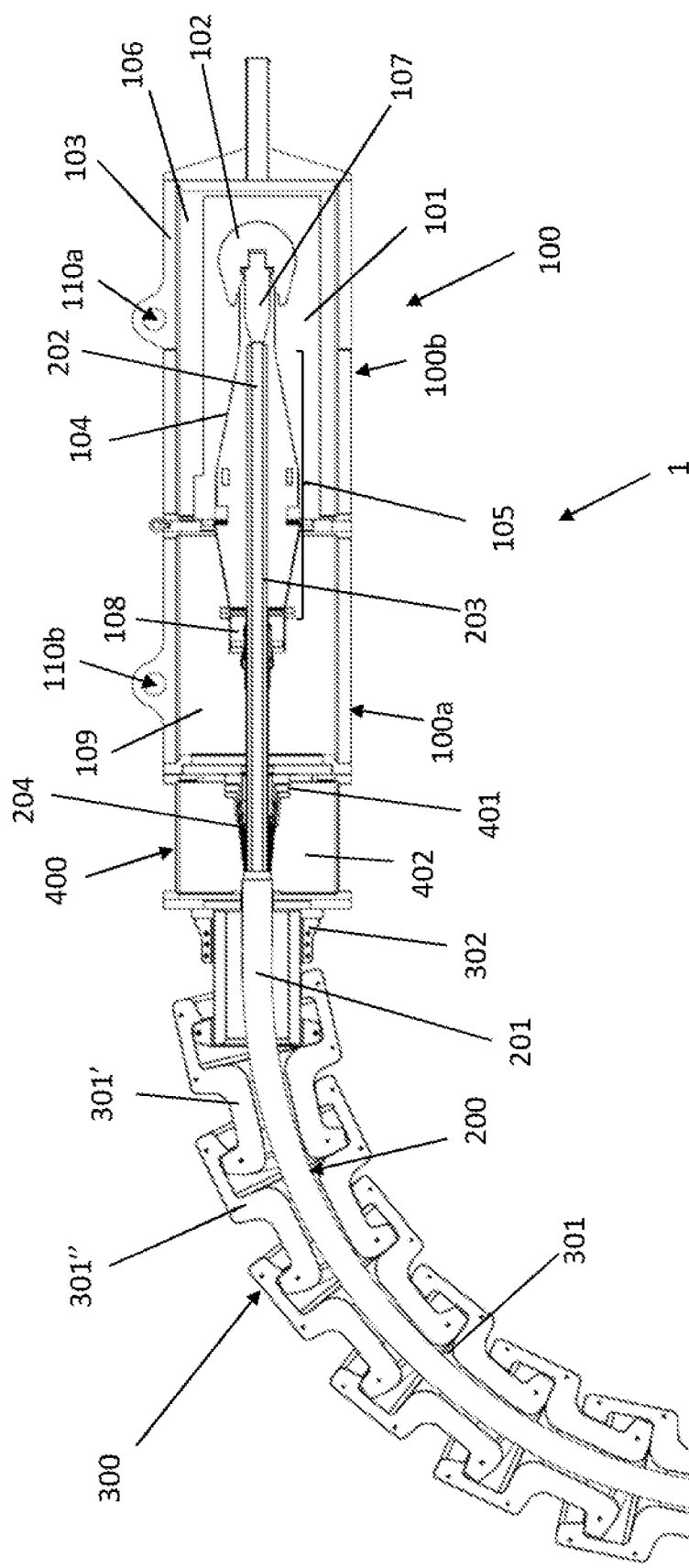
FIG. 2 is a sectional view taken along the plane A-A of the submersible apparatus in FIG. 1.

In FIG. 2, the submersible apparatus 1 of FIG. 1 is shown in sectional view and with a submarine HV cable 200 of the HV system to be tested housed therein.

Figure 3B:
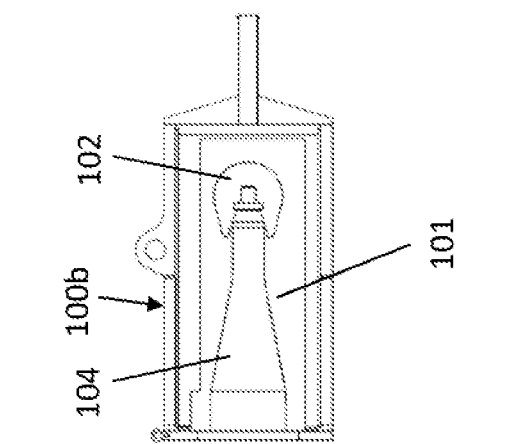
FIGS. 3a and 3b are a sectional view of an embodiment of the submersible apparatus of FIG. 2.
Figure 3A:
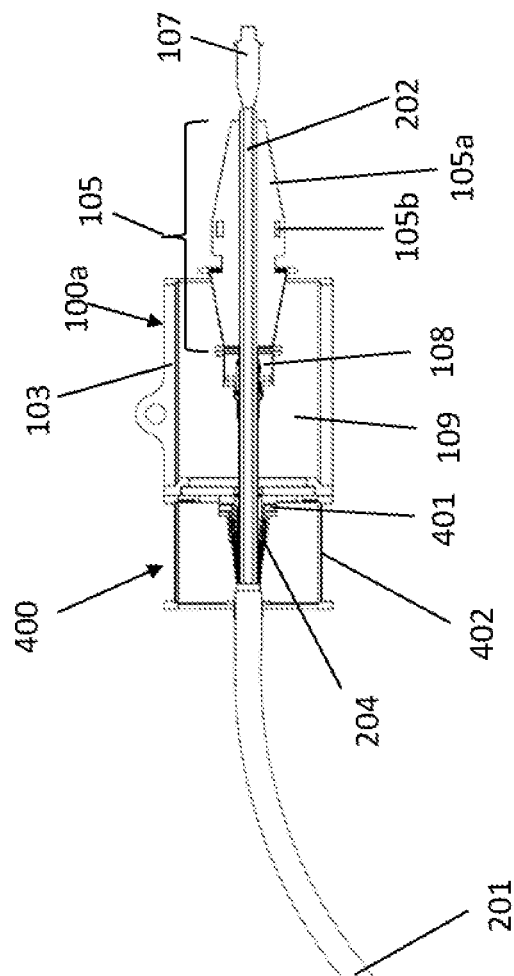

FIGS. 3a and 3b show details of an embodiment of the cable termination 100 of the present disclosure.

In FIGS. 1-3b, the cable end 201 of the cable 200 is inserted into submersible apparatus, in particular in the cable termination 100, and electrically connected thereto. The cable end 201 generally comprises a cable conductor 202, an insulating system 203 and a cable armour 204.

In an embodiment, the cable termination 100 is in two parts, a cable end insulating part (hereinafter also referred to as "insulating part") 100a and a cable end terminating part (hereinafter also referred to as "terminating part") 100b, as detailed in FIGS. 3a and 3b.

The cable termination 100 can further comprise a protective cylinder 103 as outermost portion. In case the cable termination 100 comprises a cable end insulating part 100a and a cable end terminating part 100b, as in the exemplary figures, the protective cylinder 103 is in two parts as well, one for each of the insulating and terminating part 100a and 100b.

According to an embodiment, the protective cylinder 103 comprises one or more eyelets 110a, 110b for grabbing and moving the cable termination 100.

In embodiments depicted in FIGS. 2 and 3a-3b, the cable end terminating part 100b houses an electrical insulator 101 made, for example, of epoxy resin, which encircled and is in direct contact with an electrically conductive shielding electrode 102 for the electrical connection with the cable end 201, specifically with the bare cable conductor 202. The volume 106 between the electrical insulator 101 and the protective cylinder 103 is void, optionally under vacuum.

The electrical insulator 101 and the electrically conductive shielding electrode 102 are designed to provide a cavity 104 for the connection with the cable end insulating part 100a.

The cable termination 100 further comprises an electric field control portion 105 detailed in FIG. 3a, where, in particular, the electric field control portion 105 is part of the insulating part 100a. In an embodiment, the electric field control portion 105 comprises and insulating block 105a made, for example, of insulating paper, and a deflector 105b made of semiconductive material. The cable end insulating part 100a can further comprise a screen connector 108 for the connection with the metal screen (not specifically illustrated) of the cable 200.

The cable end 201 of the cable 200 is housed into the electric field control portion 105, and the bare cable conductor 202 is mechanically and electrically connected to a cable lug 107, made of an electrically conductive metal such as copper or aluminium.

The volume 109 of the cable end insulating part 100a is void, optionally under vacuum.

The termination locking 400 can be either part of the cable termination 100 or separate from and connectable thereto. The termination locking 400 is connectable to the cable bend restrictor 300. The connections between the bend restrictor 300 on one side and to the cable termination 100 on the other side are achieved by flanges, lockers and bolts not specifically illustrated and familiar to the skilled persons.

In an embodiment, the termination locking 400 comprises a case 402 and an armour locking 401 housing a part of the cable end 201. The armour locking 401 is mechanically connected to the side of the termination locking 400 joined to the cable termination 100. Upstream, the armour locking 401 is wrapped by the cable armour 203.

With reference now to the bend restrictor 300, it comprises a through channel 301 in communication with the termination locking 400 and housing the cable end 201.

According to an embodiment, the bend restrictor 300 is a vertebral bend restrictor. It comprises a plurality of interconnected elements 301', 301" . . . having a substantially annular cross-section and which articulate when subject to an external load and lock together to a predetermined curved radius so to avoid damages of the cable 200 housed in the through channel 301. According to an embodiment, the bend restrictor 300 comprises a connecting flanges/locking 302 directly mechanically connected to the termination locking 400.

In an embodiment, each of the interconnected elements 301', 301", . . . is made in two halves which can be fastened one another once a portion of the cable 200 has been positioned into one of the halves. The same applies to the connecting flanges/locking 302.

The above-described apparatus 1 can be used for testing a submarine HV cable system comprising a cable 200 having the cable end 201.

The present disclosure relates to a method for testing a submarine HV cable system. The method of the present disclosure can be carried out onto an offshore vessel without safety problem or limits to the maximum test voltage.

The method comprises the step of arranging the cable 200, in particular the cable end 201, in the apparatus 1 comprising the cable bend restrictor 300, the termination locking 400 and the cable termination 100.

In an embodiment, the cable end 201 is first inserted into the termination locking 400 and mechanically and electrically connected to the cable termination 100. These steps are exemplified in FIGS. 4a to 4e.

Figure 4A:
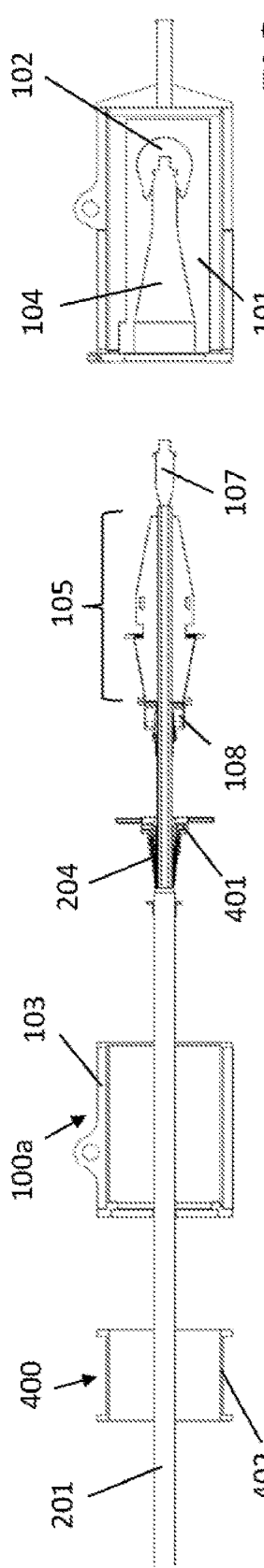

As from FIG. 4a, the cable end 201 is first inserted in the case 402 of the termination locking 400 and in the protective cylinder 103 of the insulating part 100a, if the protective cylinder 103 is into two parts. Then, the armour 204 of the cable end 201 is turn out of the cable insulation and conductor 203, 202 and wrapped around the armour locking 401, while the remaining of the cable end 201 is provided with the screen connector 108, the electric field control portion 105 and the cable lug 107.

Figure 4B:
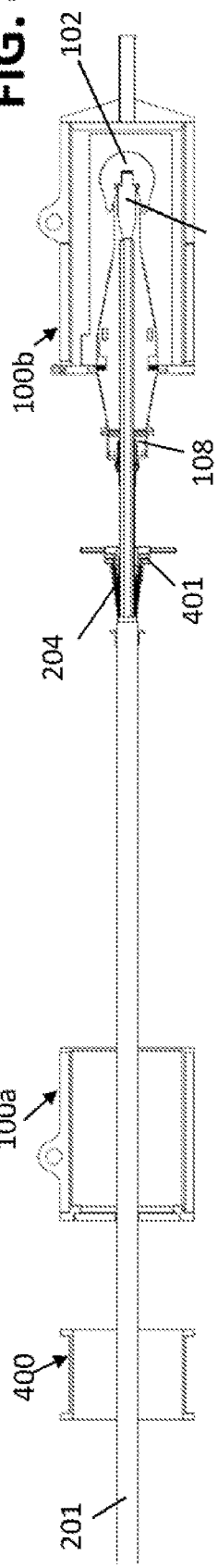

The cable end 201 with the screen connector 108, the electric field control portion 105 and the cable lug 107 is then inserted into the cable end terminating part 100b, such that the cable lug 107 is mechanically connected with the electrically conductive shielding electrode 102, as shown in FIG. 4b.

Figure 4C:
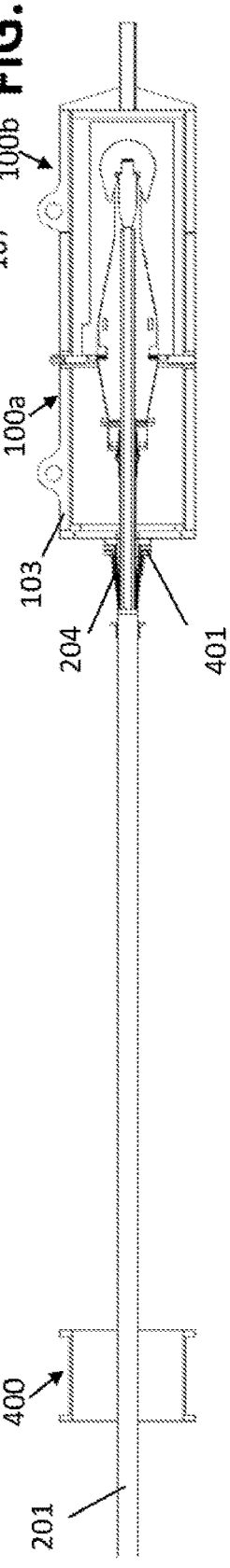

FIG. 4c shows the assembling of the insulating part 100a to the cable end terminating part 100b. During the steps described in FIGS. 4a-4c, the insulating part 100a has its protective cylinder 103 open upstream. At the end of the assembly of the insulating part 100a to the terminating part 100b, the armour locking 401 (in particular, its flange) closes the upstream opening of the protective cylinder 103.

As from FIG. 4d, the case 402 of termination locking 400 is assembled to the 103 of the insulating part 100a to enclose the armour locking 401.

Finally, as from FIG. 4e, the cable end 201 is placed in a through channel 301 formed by the connecting flanges/locking 302 and the interconnected elements 301', 301" . . . , of the bend restrictor 300. In an embodiment, when the connecting flanges/locking 302 and the interconnected elements 301', 301" . . . , are made in two halves, a portion of the cable end 201 is positioned in one of the halves, then the other half is joined. These steps are sequentially repeated for each of the connecting flanges/locking 302 and the interconnected elements 301', 301" . . . , up to the positioning of the bend restrictor 300 around the cable end 201 is completed. After the joining of the two halves around the cable end 201, each of the connecting flanges/locking 302 and the interconnected elements 301', 301" . . . is connected to a downstream element which, in the case of the connecting flanges/locking 302, is the termination locking 400, in the case of a first interconnected elements 301', is the connecting flanges/locking 302, in case of a second interconnected elements 301" is the first interconnected elements 301', and so on.

Once the cable 200, in particular the cable end 201, is positioned into and electrically and mechanically connected to the submersible apparatus 1, at least the cable termination 100 is laid down to the sea floor, and the desired electric tests (like the ones previously exemplified) can be performed on the cable of the submarine high voltage cable system.

Once the electric tests are fulfilled, the submersible apparatus 1, in particular the cable termination 100 with the cable inserted therein, can be recovered onto the vessel and used for future test.

The invention claimed is:

1. A submersible apparatus for testing a submarine high voltage (HV) cable system, comprising:
    a cable termination comprising an electrical insulator and a shielding electrode for an electrical connection with a cable end;
    a cable bend restrictor comprising a through channel; and
    a termination locking in through communication with the cable bend restrictor and the cable termination;
wherein the electrical insulator electrically insulates the shielding electrode from the bend restrictor and the termination locking.

2. The submersible apparatus of claim 1, wherein the cable end comprises a cable conductor, an insulating system and a cable armour.

3. The submersible apparatus of claim 1, wherein the cable termination comprises two parts, specifically a cable end insulating part and a cable end terminating part.

4. The submersible apparatus of claim 1, wherein the cable termination comprises a protective cylinder.

5. The submersible apparatus of claim 3, wherein the cable termination comprises a protective cylinder having two parts, one for each of the cable end insulating part and the cable end terminating part.

6. The submersible apparatus of claim 3, wherein the cable end terminating part houses the electrical insulator in direct contact with the shielding electrode.

7. The submersible apparatus of claim 3, wherein the cable termination comprises an electric field control portion as an optional part of the cable end insulating part.

8. The submersible apparatus of claim 1, wherein the termination locking is part of the cable termination or is separate from and connectable thereto.

9. The submersible apparatus of claim 1, wherein the termination locking comprises a case and an armour locking.

10. The submersible apparatus of claim 1, wherein the cable bend restrictor comprises a plurality of interconnected elements.

11. The submersible apparatus of claim 10, wherein the cable bend restrictor further comprises a connecting flanges and locking assembly directly mechanically connected to the termination locking.

12. The submersible apparatus of claim 11, wherein each of the interconnected elements and the connecting flanges and locking assembly is made in two halves which can be fastened to one another.

13. A method for testing a submarine high voltage (HV) cable system, comprising the steps of:
    arranging a cable in a submersible apparatus comprising a cable bend restrictor, a termination locking and a cable termination by the following sub-steps:
    inserting a cable end of the cable through the termination locking;
    connecting the cable end, provided with an electric field control portion, to an electrically conductive shielding electrode housed within an electrical insulator in the cable termination;
    assembling the termination locking to the cable termination; and
    positioning the cable end in the bend restrictor while connecting the bend restrictor to the termination locking,
the sub-steps of inserting and connecting the cable end being carried out before the sub-step of positioning the cable end in a cable bend restrictor;
    laying down the submersible apparatus containing the cable end to a sea floor;
    energizing the cable to perform an electric test thereon;
    de-energizing the cable; and
    recovering the submersible apparatus containing the cable end;
wherein the electrical insulator electrically insulates the shielding electrode from the bend restrictor and the termination locking.

14. The method according to claim 13, wherein the step of connecting the cable end, provided with an electric field control portion, to an electrically conductive shielding electrode is preceded by a step of inserting the cable end in a protective cylinder of the cable termination, then provided with an electric field control portion.

15. The method according to claim 13, wherein the step of positioning the cable end in the bend restrictor is performed by:
    using the bend restrictor comprising a connecting flanges and locking assembly and interconnected elements made into two halves;
    placing the cable end in a through channel formed by one half of the connecting flanges and locking assembly and, sequentially, of each interconnected element;
    joining the two halves of the connecting flanges and locking assembly and, sequentially, of each interconnected element;
    connecting the connecting flanges and locking assembly and, sequentially, each interconnected element to a downstream element.

* * * * *